(12) United States Patent
Schieke et al.

(10) Patent No.: US 6,775,526 B2
(45) Date of Patent: Aug. 10, 2004

(54) MODULATED INPUT SIGNAL FILTER

(75) Inventors: Pieter Schieke, Phoenix, AZ (US); Steven Dawson, Scottdale, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 481 days.

(21) Appl. No.: 09/728,191

(22) Filed: Dec. 1, 2000

(65) Prior Publication Data

US 2002/0067079 A1 Jun. 6, 2002

(51) Int. Cl.[7] .................................................. H04B 1/10
(52) U.S. Cl. ....................... 455/218; 455/222; 455/223; 375/351; 340/426.28; 340/5.72; 340/539.1
(58) Field of Search ................................. 455/218, 213, 455/223, 222, 212; 375/351, 346; 327/97; 379/446; 340/539.1, 426.28, 5.73, 5.72, 10.33

(56) References Cited

U.S. PATENT DOCUMENTS

| | | | | |
|---|---|---|---|---|
| 4,172,996 A | * | 10/1979 | Tokunaga et al. ........... | 455/218 |
| 4,203,072 A | * | 5/1980 | Beningfield et al. ........ | 455/223 |
| 4,327,446 A | * | 4/1982 | Dressler ..................... | 455/223 |
| 4,342,120 A | * | 7/1982 | Settlemire et al. .......... | 455/222 |
| 4,682,045 A | * | 7/1987 | Amazawa et al. .......... | 307/125 |
| 5,142,554 A | | 8/1992 | Stribling et al. .............. | 375/76 |
| 5,161,185 A | * | 11/1992 | Hochschild ................. | 379/416 |
| 5,463,662 A | * | 10/1995 | Sutterlin et al. ............ | 375/351 |
| 5,530,401 A | | 6/1996 | Cao et al. .................... | 327/563 |
| 5,970,399 A | * | 10/1999 | Rostamy et al. ............ | 455/222 |

\* cited by examiner

*Primary Examiner*—Nina Tong
(74) *Attorney, Agent, or Firm*—Baker Botts L.L.P.

(57) ABSTRACT

A modulated input signal is filtered to reduce noise. The state of the input signal controls the state of a switch. Depending upon its state, the switch connects one of two circuits to a gate. The gate receives the input signal and it passes or blocks the signal depending upon the state of the signal received from the switched circuits. When it is passing the input signal, the output of the gate is equivalent to the input signal. When it is blocking the input signal, the output of the gate is set to a default state. The default state is independent of the input signal. One of the switched circuits gradually modifies the signal provided by the gate to allow the input signal to pass through. The other switched circuit gradually modifies the signal provided to the gate to block the input signal.

33 Claims, 5 Drawing Sheets

MODULATED INPUT SIGNAL FILTER

BACKGROUND OF THE INVENTION

The invention relates to information transmission systems and, more particularly, to the structure and operation of a modulated input signal filter.

DESCRIPTION OF THE RELATED TECHNOLOGY

Many new commercial applications require electronic devices that are able to communicate while maintaining low power consumption. Mobile devices are less convenient if large battery requirements increase their size or weight. Devices mounted on or in automobiles that operate when the engine is inactive must also be able to operate with only low power in order, for example, to avoid draining a car battery.

Electronic devices can communicate using modulated signals. A characteristic of an electronic signal, e.g., amplitude, frequency, phase, etc., is modified in a pattern that corresponds to information. Such modification is referred to as modulation. One type of modulation is pulse width modulation. Pulse width modulation uses a pattern defined by duty cycle to correspond to zeros and ones. Duty cycle is the ratio of the time that a signal is in a first state to the time that the signal is in a second state during a specific time interval. For example, a signal with a high state and a low state is used for digital communication. An interpretation of 25% of time in the high state as a one and 75% of the time in the high state as a zero is one implementation of pulse code modulation.

The modulated electronic signal is then transmitted and received. The receiver compares the modifications to the pattern to determine the information that was intended to be transmitted. The receiver, however, does not analyze an exact copy of the modulated signal. Electronic devices near the receiver as well as physical imperfections in the transmission and reception equipment and the transmission medium combine to add a random signal referred to as noise.

The noise added to the modulated signal, noise can be negative as well as positive, can complicate or create errors in the communication where the noise is significant in relation to the amount of modification corresponding to information. In situations where low power is desirable, noise can also cause a receiver to operate at a higher power level as it attempts to determine what information was intended to be sent by the noise signal. A receiver may successfully determine that the noise does not represent information, but spend an undesirably significant amount of power in producing that output. In situations where the microcontroller in the receiver is performing a background task, processing time is undesirably diverted to analyze noise.

Some receivers for devices such as garage doors pass the digital signal corresponding to the modulation on to a microcontroller that determines whether the signal is authorized to actuate the device. Increased levels of security can correspond to greater power use in the microcontroller. A sleep mode can be used to reduce the power consumption of the microcontroller when no signal is present.

U.S. Pat. No. 5,463,662 discloses an apparatus for reducing errors in data caused by noise. A signal whose amplitude is modified in accordance with information is sampled by an analog-to-digital converter to provide digital signals representative of the sample. A low frequency offset is then subtracted from the digital signals. The resulting signal is compared to its average level and the comparison output is used as a control signal to determine when a blanking circuit will blank the digital signal. The selective removal of noise effects can reduce errors, but does not significantly reduce the amount of power used by the receiver in detecting valid signals.

SUMMARY OF THE INVENTION

The present invention is directed to a modulated input signal filter, a method filtering, and systems employing the apparatus or method.

In an embodiment of the modulated input signal filter of the present invention, a switch responds to the input signal by coupling one of two circuits to a gate. The input signal is also coupled to the gate. The gate operates to either pass through the input signal as an output or to output a default signal regardless of the input signal state. One of the circuits coupled by the switch influences the gate over time to pass through the input, while the other circuit influences the gate over time to output the default signal.

In a more specific embodiment of the present invention, the input signal is a voltage and has two states corresponding to lower and higher voltage ranges. Each of the two circuits includes a capacitor, but one circuit drains the capacitor with a current source while the other charges the capacitor with a current source. The gate receives the voltage currently on the capacitor as an input. When that voltage is in a high state, the gate passes the input signal through to its output. When, the capacitor voltage is in a low state, the gate outputs a default signal. A high voltage input signal couples the charging current source to the capacitor and results in the input signal being passed through the gate in a specific period of time that depends on the initial voltage of the capacitor. In one embodiment, the gate passes through the input signal within 3 milliseconds of being connected to the charging circuit.

In one system embodiment of the present invention, the input signal is received at an antenna. The output signal of the gate is coupled to a microcontroller. The microcontroller is coupled to an automobile door lock mechanism to unlock the automobile door when a specific signal is received. In a more specific embodiment, the microcontroller has a sleep mode that is entered after receiving the default signal for a specified time from the gate output. The sleep mode uses less power than than mode is which the microcontroller analyzes received input signals for the specific signal.

In another system embodiment of the present invention, the input signal is received at an antenna. The output signal of the gate is coupled to a microcontroller. The microcontroller is coupled to a pet door lock mechanism to unlock the pet door when a specific signal is received. In a more specific embodiment, the microcontroller has a sleep mode that is entered after receiving the default signal for a specified time from the gate output. The sleep mode uses less power than than mode is which the microcontroller analyzes received input signals for the specific signal.

In a method embodiment of the present invention, an input signal is filtered by the application of specific steps. The input signal is received by an antenna. The ratio of time that the input signal is high relative to the time that the input signal is low is measured. The input signal is blocked from reaching an output if the input signal has not been in a high state for a specified length of time. The input signal is blocked if the measured ratio is less than a specified ratio. If the input signal is not blocked it is transmitted to the output. The output is connected to a circuit with sleep functionality.

A feature of the invention is filtering an input signal.

Another feature is operating communications systems at low power.

An advantage of the present invention is setting a receiver to ignore noise based on length characteristics of the noise.

Another advantage is ignoring noise based on the duty cycle of the noise.

Still another advantage is decreasing the power used by a signal analyzing microcontroller or circuit by blocking noise signals.

Another advantage is allowing an override to selectively impose a time delay on signal receipt.

Other and further features and advantages will be apparent from the following description of presently preferred embodiments of the invention, given for the purpose of disclosure and taken in conjunction with the accompanying drawings. Not all embodiments of the invention will include all the specified advantages. For example, one embodiment may only ignore noise based on the duty cycle of the noise, while another only decreases the power used by the signal analyzing microcontroller.

DETAILED DESCRIPTION OF THE PREFERRED EMBODIMENTS

Figure 1:
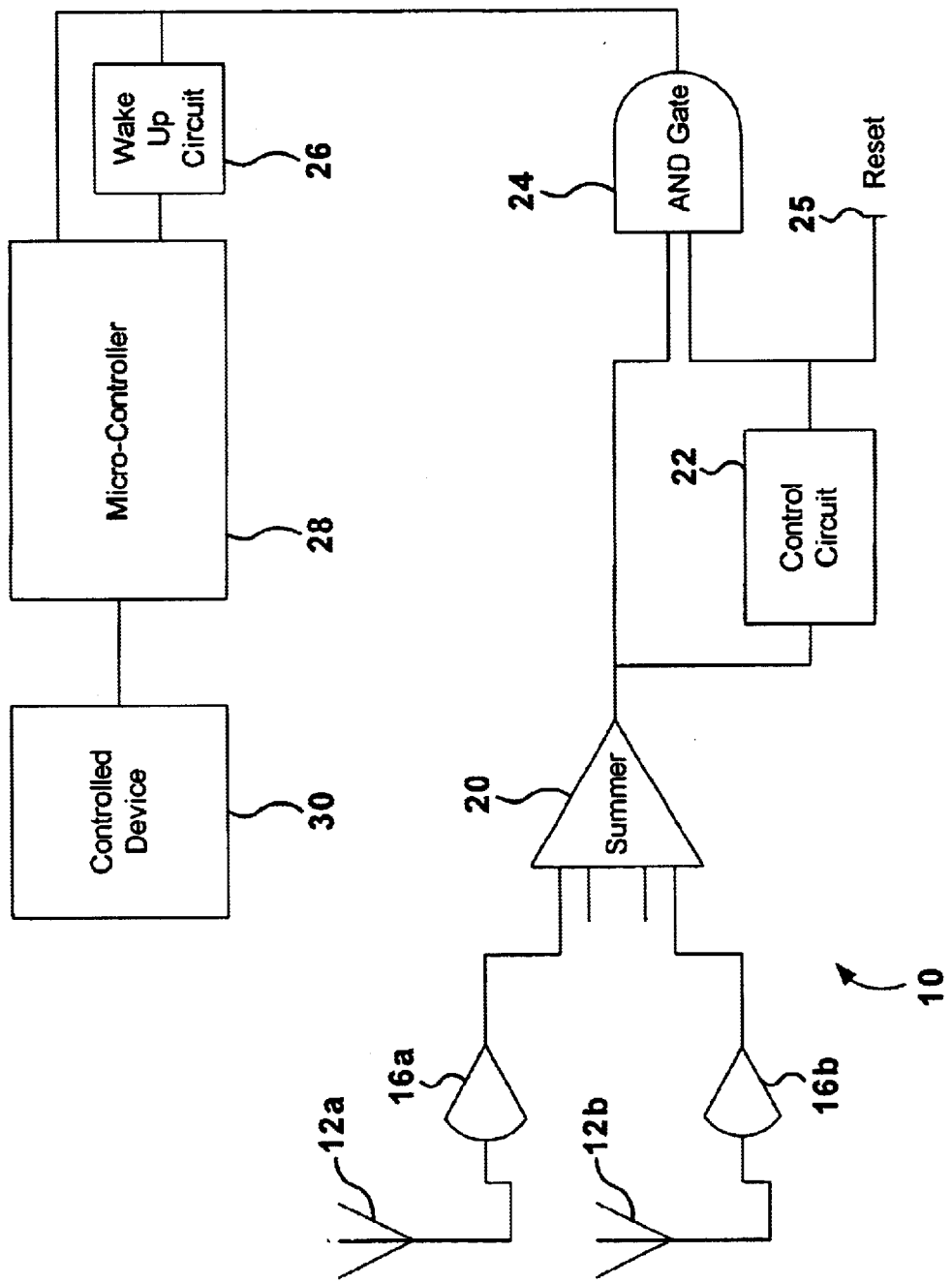
FIG. 1 is a schematic block diagram of a microcontroller system with an input signal receiver and a filter.

The invention is a filter for an input signal in which the transmittance of the signal depends on the historical state of the signal. The invention may be used to block noise that would bring a microcontroller out of a low power sleep state. The receiver with filter may be fabricated on the same or different die as the microcontroller. The invention may also include input for modifying the required input signal history for transmittance.

Referring now to the drawings, the details of preferred embodiments of the invention are schematically illustrated. Like elements in the drawings will be represented by like numbers, and similar elements will be represented by like numbers with a different lower case letter suffix.

Referring to FIG. 1, a schematic block diagram of a microcontroller system with an input signal receiver and a filter is illustrated. The microcontroller system is generally represented by the numeral 10. The microcontroller system 10 may be fabricated on one or more integrated circuit dice and enclosed in an integrated circuit package. The integrated circuit package may be, for example, but not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, T0–247 and T0–263.

The microcontroller system includes two antennas 12a, 12b. The antennas receive signals propagating through the atmosphere. Other embodiments of the invention can include one or three antennas. Multiple antennas can be arranged orthogonally to maximize the probability of receiving a signal. Each antenna 12a, 12b is coupled to provide any signals it receives to one of the amplifiers 16a, 16b. The resulting input signals are combined in a summer 20. In another embodiment of the invention, a filter is placed between each antenna 12a, 12b and the summer 20 rather than between the summer 20 and the rest of the microcontroller system 10.

The output of the summer 20 is coupled as an input to the AND gate 24 and the control circuit 22. The AND gate 24 and control circuit 22 act together to filter the signal. In another embodiment of the invention, another type of gate such as a NAND, OR, or NOR gate is used instead of the AND gate 24. An alternative embodiment includes a gate that acts as a combination of an OR gate stage and an AND gate stage. The control circuit 22 output is coupled to an OR gate stage input along with an override signal. The OR gate stage output is then provided as an input to the AND gate stage along with the input signal from the summer 20. In this manner, a high override signal causes the AND gate to pass the input signal regardless out of the output of the control circuit 22 without affecting the output of the control circuit 22. A low override signal then allows the control circuit 22 to determine from its present state whether the input signal will be transmitted or blocked. Those of ordinary skill in the art would realize that there are many circuits and gates that could implement the alternative embodiment described above.

The filter components of FIG. 1 also include an reset input 25. The reset input 25 can force the output of the control circuit 22 high. Unlike the override input of the alternative embodiment, the control circuit 22 state is not preserved when the reset input 25 is driven high. The reset input 25 can be driven high temporarily to allow the filter to receive and transmit input signals without a delay, but maintaining the duty cycle requirement for continued transmission of the input signal.

The output of the AND gate 24 is coupled to a microcontroller 28 and a wake up circuit 26. In one embodiment, the wake up circuit 26 is a component of the microcontroller 28. The microcontroller 28 has a low power sleep or standby mode and a higher power active mode. When the AND gate 24 outputs a high signal while the microcontroller is in sleep mode, the wake up circuit 26 activates the microcontroller 28. When the AND gate has output low signals for a specified time, the microcontroller 28 enters sleep mode. In active mode the microcontroller 28 analyzes the signal received from the AND gate 24. If the signal matches a code signal, the microcontroller 28 activates a controlled device 30. In one embodiment, the controlled device is an automobile door lock that unlocks in response to the signal from the microcontroller 28.

Figure 2:
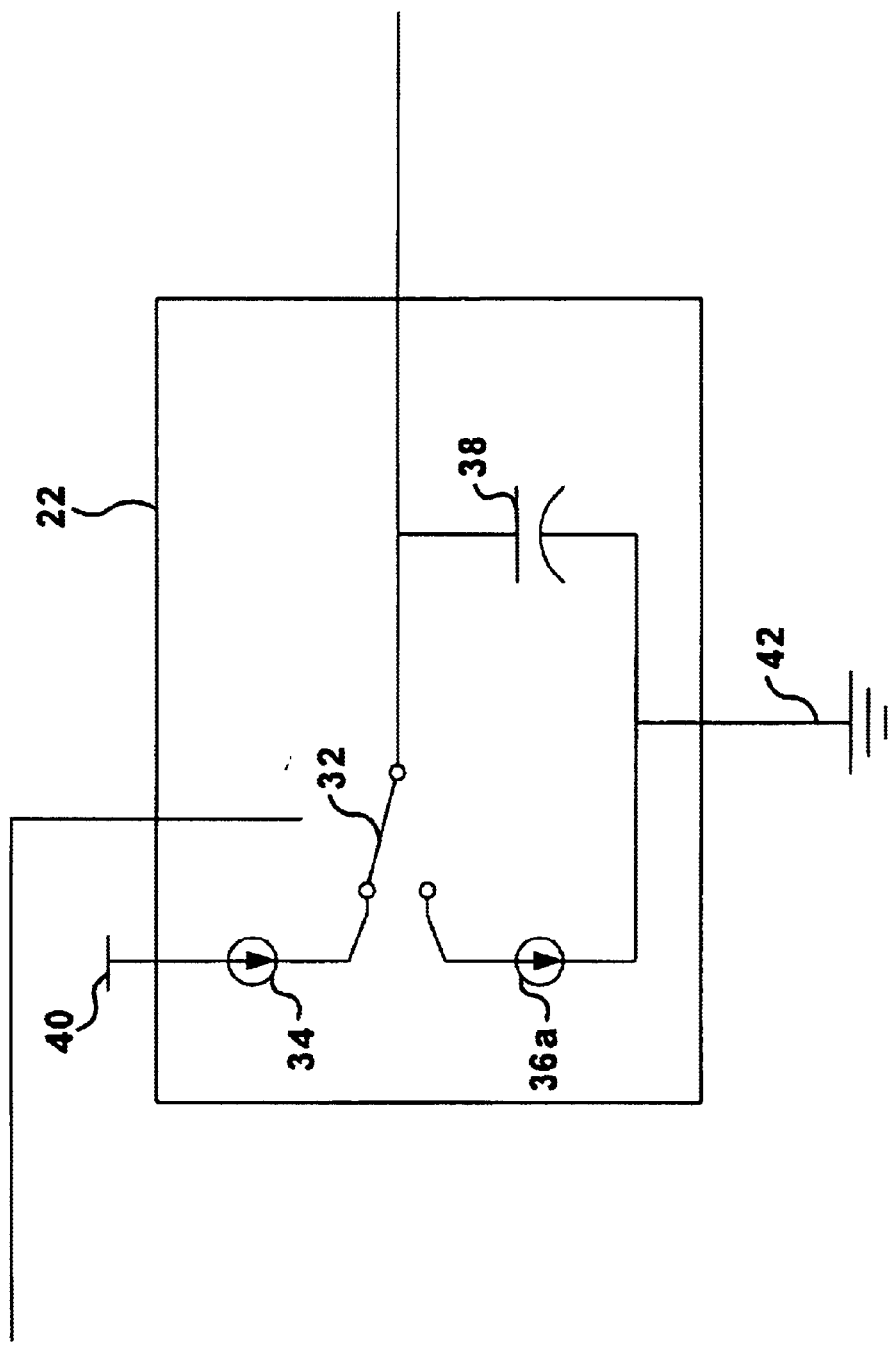
FIG. 2 is a circuit diagram of one embodiment of a modulated input signal filter.

Referring now to FIG. 2, a circuit diagram of one embodiment of a control circuit 22 is illustrated. The switch 32 is driven by the input signal from the summer 20. When the input signal is high, the switch 32 connects a current source 34 to the capacitor 38, forming a circuit that is connected to the AND gate 24 input. The current source is also connected to a high voltage point 40. When the input signal is low, the switch 32 connects current source 36a to the capacitor 38, forming a circuit that is connected to the AND gate 24 input. Both the capacitor 38 and the current source 36a are connected to ground 42.

When the switch 32 connects current source 34 to the capacitor 38, the voltage on the capacitor 38 is increased until it reaches high level. When the switch connects current source 36a to the capacitor 38, the voltage on the capacitor is decreased until it reaches ground. The ratio of magnitudes between the current source 34 and current source 36a determines the duty cycle of the input signal that will allow the voltage on the capacitor 38 to be maintained. In one embodiment, a minimum duty cycle of 25% is attained by current source 34 having approximately three times the magnitude of current source 36a. A magnitude factor of between 2.9 and 3.1 is sufficient in one embodiment. The 75% of the time that the input signal is low results in an equal and opposite current from the capacitor 38 as the 25% of the time that the input signal is high. With the same amount of charge being removed and then added (or the inverse) the voltage over the capacitor 38 returns to the same level.

In addition to controlling the required duty cycle, the attributes of the current source 34 and capacitor 38 determine the hold time or duration of high level input signal guaranteed to pass the input signal through the AND gate 24. The voltage on the capacitor 38 corresponds to the charge by the following equation V=q/C where V is the voltage, q is the charge, and C is the capacitance. When the capacitor 38 has no voltage, is at ground, the current source 34 must be connected long enough to provide an amount of charge that corresponds to a voltage level of high. That duration is determined by the capacitance, because the ratio of charge to voltage equals the capacitance. The magnitude of the current sources 34, 36a and the capacitance of the capacitor 38 can be modified to independently control the duty cycle requirement and the hold time.

Figure 3:
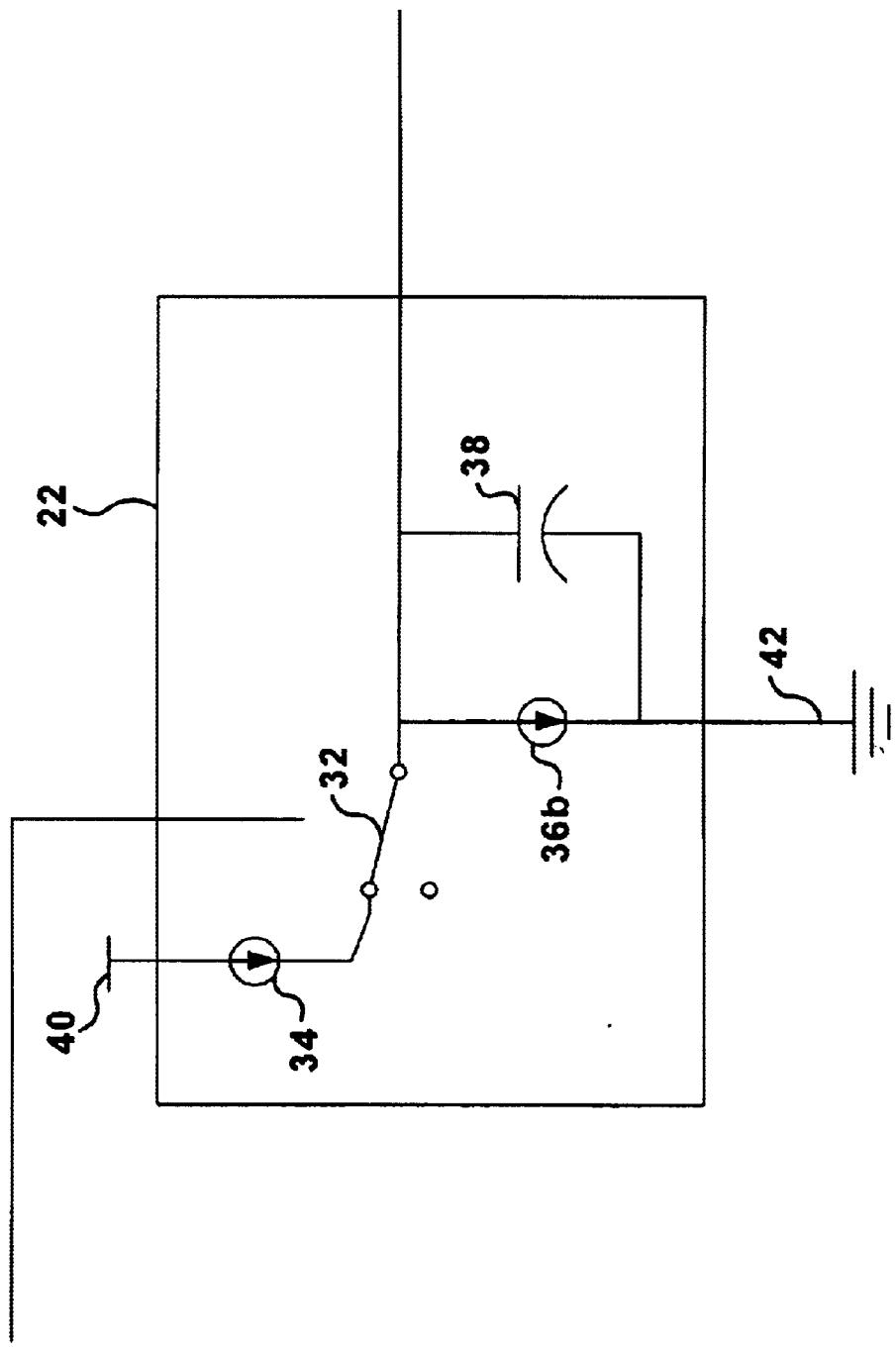
FIG. 3 is a circuit diagram of one embodiment of a modulated input signal filter.

Referring now to FIG. 3, a circuit diagram of another embodiment of a control circuit 22 is illustrated. In this embodiment, a current source 36b that drains the capacitor 38 is connected regardless of the state of the switch 32. The current source 34 that charges the capacitor 38 is only connected when the switch 32 receives a high input from the input signal. The hold time and duty cycle can be determined in the same way as discussed with reference to FIG. 2, though the difference between the charging current source 34 and draining current source 36b is used as the current source magnitude in the calculations. Many other circuit configurations are possible to implement the control circuit 22. FIGS. 2 and 3 illustrate some of the possibilities.

Figure 4:
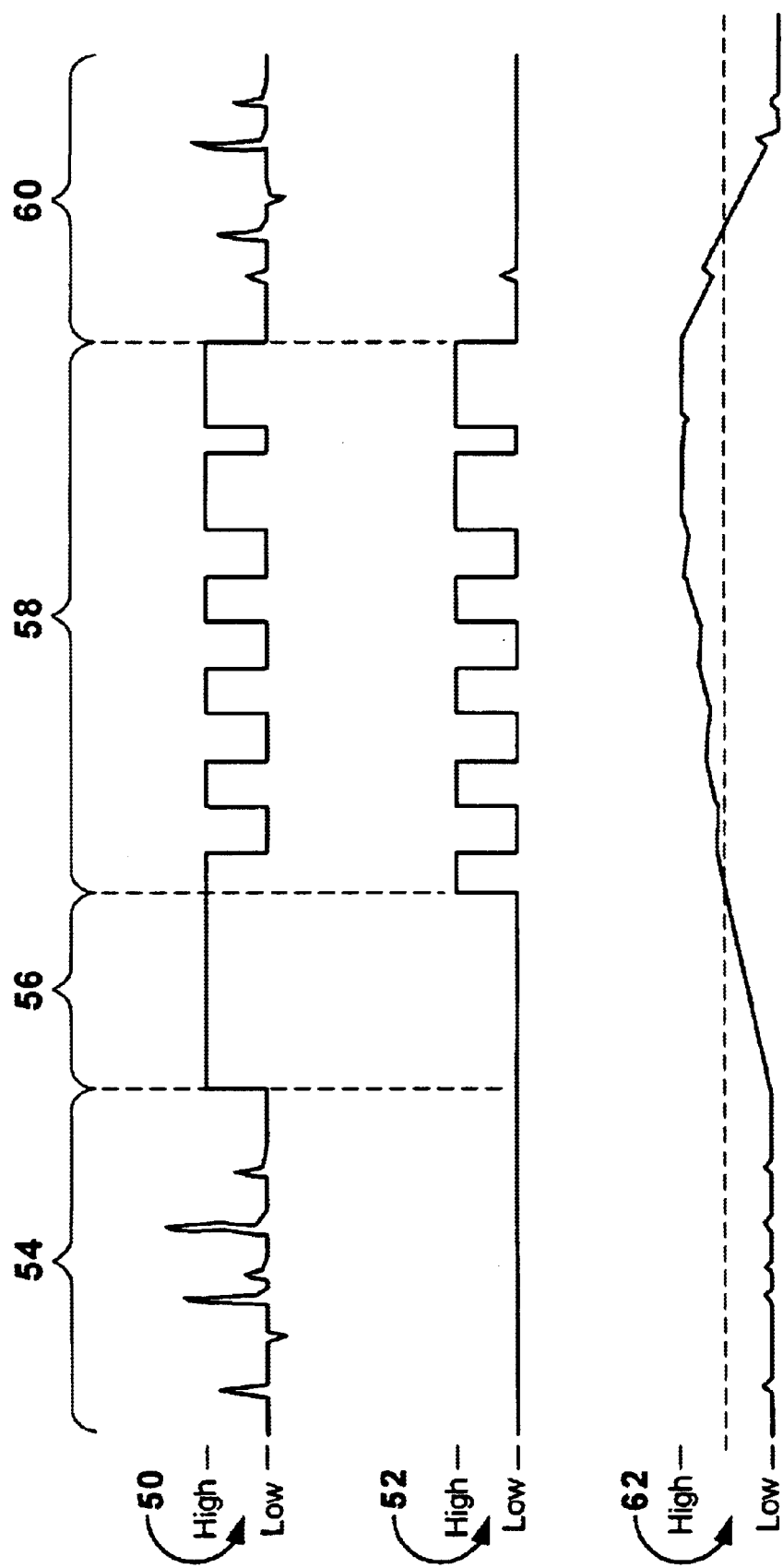
FIG. 4 is a chart of signals in time for the input and output of a modulated input signal filter.

Referring to FIG. 4, a chart of signals in time for the input and output of a modulated input signal filter are illustrated. The input signal 50 is received from the antennas 12a, 12b. The gate 24 outputs a filtered signal 52 to the microcontroller 28 and wake up circuit 26. The control signal 62 is received by the gate 24 and determines whether the input signal 50 is passed or blocked. Each of the signals is shown with two states, high and low. Different sets of states can be used to control the filtering of the input signal.

The first portion 54 of the input signal 54 includes noise artifacts though no signal is present. Though the artifacts have some effect on the control signal 62, none of those effects are sufficient to change the control signal 62 from low to high. The division between low and high is indicated by the dotted line. Because the control signal 62 stays low, the filtered signal 52 does not include the noise artifacts and the microcontroller 28 does not leave its low power sleep mode.

The second portion 56 of the input signal 54 is a high state of duration equal to the hold time as determined by the component values of the control circuit 22. At the end of the second portion 56, the control signal 62 has just exceeded the dotted line and is interpreted as a high state by the gate 24. As a result, the gate 24 stops blocking the input signal 50 and begins to pass it through as the filtered signal 52.

The third portion 58 of the input signal 50 contains duty cycle coded information. The duty cycle of each bit is equal to or greater than the required duty cycle determined by the components of the control circuit 22. The control signal 62 stays high during this period and gradually rises above the dividing line between low and high. As a result, the gate 24 continues to pass through the input signal 50 as the filtered signal 52. In an alternative embodiment, certain information states may be less than the required duty cycle so that a large group of those bits or states will cause the gate 24 to block the input signal 50.

In fourth portion 60 of the input signal 50 the duty cycle encoded signal has been discontinued, but noise artifacts are still present. The control signal 62 is driven low in the absence of a signal. While some noise is transmitted before the control signal 62 achieves a low state, the noise received thereafter is not allowed into the filtered signal 52. Because the microcontroller 28 receives only the filtered signal 52 rather than the input signal 50, it can enter a sleep mode to conserve power.

Figure 5:
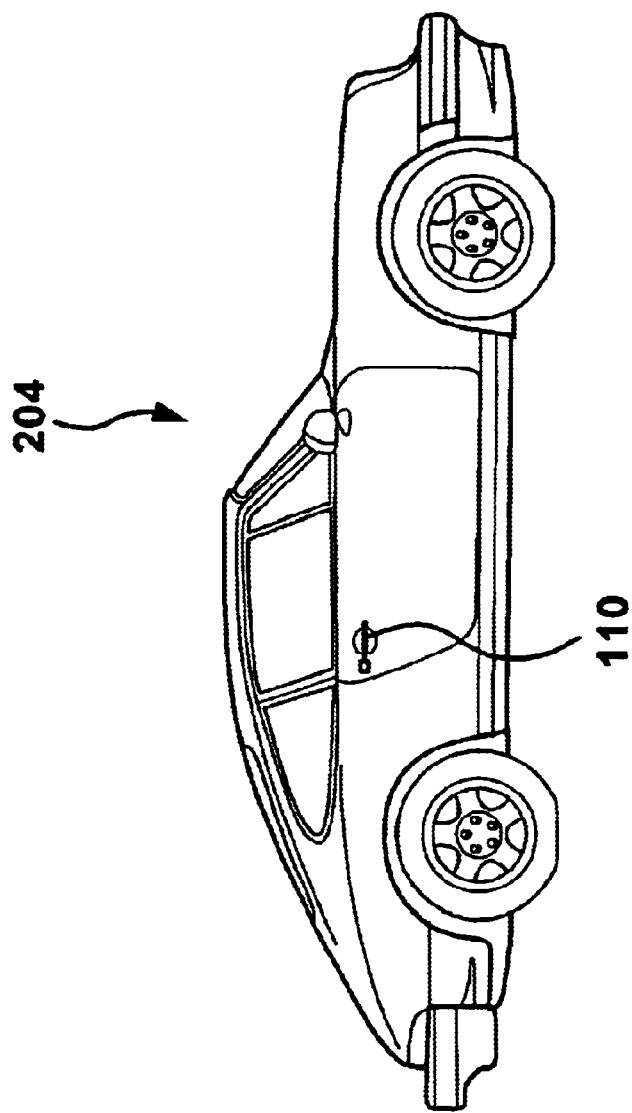
FIG. 5 is an illustration of a system employing the input signal filter.
Figure 5:
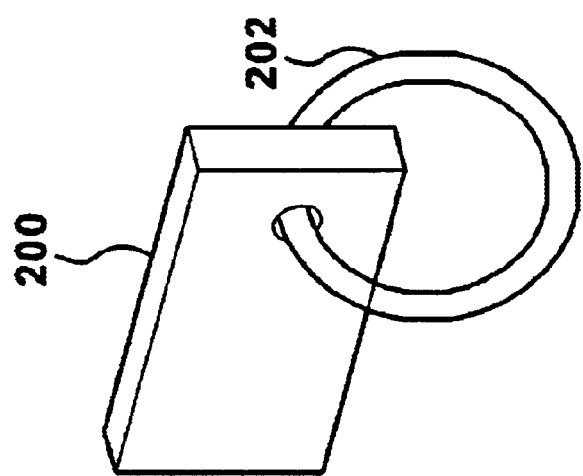

Referring to FIG. 5, a consumer system employing the input signal filter is illustrated. An automobile 204 includes a circuit capable of unlocking the doors 110. The circuit 110 transmits a duty cycle encoded signal. A microcontroller and receiver are included on a passive key 200 that can be mounted on a key ring 202. When the passive key 200 is distant from the automobile 204, the receiver filters noise out and the microcontroller stays in a sleep mode that conserves energy. When the passive key 200 approaches the automobile, the signal from the circuit 110 becomes strong enough to be received by the antennas and drives the control signal to high. Once the control signal is high, the input signal is passed on to the microcontroller 28 which returns a signal recognized by the circuit 110. The circuit 110 then unlocks the automobile 204 doors. In an alternative embodiment, the receiver, filter, and microcontroller may be provided on the automobile 204. In that embodiment, the key 200 is active and sends a signal when actuated. The signal drives the control signal to high and wakes the microntroller. The microcontroller analyzes the signal and opens the doors in response.

The invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alternation and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A system that filters an input signal, said system comprising:

a switch having first and second settings, operable to maintain the first setting in response to a first state of the input signal, and operable to maintain the second setting in reponse to a second state of the input signal;

a gate having an output and first and second inputs with the first input coupled to receive the input signal, the output of the gate comprising a default signal when the second input receives one of a first range of states, the output of the gate having the same state as the input signal when the second input receives one of a second range of states;

a first circuit connected to the second input of the gate when the switch maintains the first setting, the first circuit causing the the second input of the gate to eventually receive one of the first range of states; and a second circuit connected to the second input of the gate when the switch maintains the second setting, the second circuit causing the the second input of the gate to eventually receive one of the second range of states.

2. The system of claim 1, wherein the gate is an AND gate.

3. The system of claim 1, wherein the first range of states are a continuous group of lower voltages and the second range of states are a continuous group of higher voltages.

4. The system of claim 3, wherein the second input of the gate receives one of the second range of states within 3 milliseconds of the switch maintaining the second setting.

5. The system of claim 3, wherein the maximum time duration in which the second input of the gate receives one of the second range of states after the switch maintains the second setting is adjustable by changing a capacitor.

6. The system of claim 1, further comprising a first antenna operable to receive the input signal and coupled to the switch and the first input of the gate.

7. The system of claim 6, further comprising a second antenna operable to receive the input signal and coupled to the switch and the first input of the gate.

8. The system of claim 1, wherein the first circuit comprises a first current source coupled to a capacitor.

9. The system of claim 8, wherein the second circuit comprises a second current source coupled to the capacitor.

10. The system of claim 9, wherein the first and second current sources provide opposing current flow relative to the capacitor.

11. The system of claim 10, wherein the magnitude of the second current source equal the product of the magnitude of the first current source and a number within the range of 2.9 and 3.1.

12. The system of claim 10, wherein the magnitude of the second current source and the magnitude of the first current source are adjustable to set a minimum duty cycle.

13. The system of claim 1, wherein the first state is low, the second state is high, and the default signal is a constant low state.

14. The system of claim 1, further comprising a reset input coupled to the second input of the gate, the reset input is operable to force the second input to receive one of the second range of states immediately when the reset input is actuated.

15. The system of claim 1, further comprising an override input coupled to the gate, the override input forcing the gate output to match the first input of the gate when the override input is actuated.

16. The system of claim 1, further comprising a microcontroller coupled to the output of the gate.

17. The system of claim 16, wherein the microcontroller shifts to a lower power state after receiving the default signal from the gate output for a specified period of time and the microcontroller includes a wake up circuit that shifts the microcontroller to a higher power state after receiving a signal other than the default signal from the gate output.

18. The system of claim 16, further comprising:

a door lock mechanism mounted on an automobile and controlled by the microcontroller and wherein the microcontroller is mounted on the automobile, analyzes the gate output for an actuating signal, and unlocks the door lock machanism upon receiving the actuating signal.

19. A method for filtering an input signal, comprising the steps of:

receiving a first signal from a first antenna;

generating an input signal including at least the first signal;

measuring the ratio of time during which the input signal is high relative to the time during which the input signal is low;

blocking the input signal from reaching an output unless the input signal has been high for more than a first specified length of time;

blocking the input signal from reaching the output when the measured ratio is less than a specified value for a second specified length of time; and connecting the output to a circuit with sleep functionality.

20. The method of claim 19, wherein the step of blocking is performed by an AND gate.

21. The method of claim 19, wherein the step of measuring is performed by a capacitor.

22. The method of claim 19, wherein the circuit with sleep functionality is a microcontroller and further comprising the steps of:

comparing the input signal to a code; and unlocking an automobile door when the input signal matches the code.

23. The method of claim 19, further comprising the steps of:

measuring a second signal received at a second antenna;

measuring a third signal received at a third antenna; and wherein the input signal comprises the sum of the first, second, and third signals.

24. The method of claim 23, wherein the antennas are aligned orthogonally.

25. The method of claim 19, further comprising the steps of:

comparing the input signal to a code; and unlocking a pet door when the input signal matches the code.

26. A system that filters an input signal, said system comprising:

means for selectively blocking the input signal based on a control signal;

first biasing means for modifying the control signal towards a blocking state coupled to the means for selectively blocking the input signal via a connecting means;

second biasing means for modifying the control signal away from the blocking state coupled to the means for selectively blocking the input signal via the connecting means; and the connecting means operable to connect one of the first and second biasing means to the means for selectively blocking the input signal in response to the state of the input signal.

27. The system of claim 26 wherein the blocking state of the control signal is a low voltage state.

28. The system of claim 26 wherein the first biasing means modifies the control signal at a first rate, the second biasing means modifies the control signal at a second rate, the first rate and second rate are of different sign, and the first rate has a magnitude between 2.9 and 3.1 times the second rate.

29. The system of claim 26 wherein the means for selectively blocking the input signal outputs a default state when the control signal is in the blocking state.

30. The system of claim 29 wherein the default state is a low voltage state.

31. The system of claim 30 further comprising a signal analysis means coupled to the output of the means for selectively blocking the input signal, the signal analysis means shifting to a lower power state after receiving the default signal from the gate output for a specified period of time and the signal analysis means including a wake means for shifting to a higher power state after receiving a signal other than the default signal.

32. The system of claim 26 further comprising means for resetting the control signal to a non-blocking state.

33. The system of claim 26 further comprising override means for selectively forcing the means for selectively blocking the input signal not to block the input signal when the control signal is in the blocking state.

* * * * *